(12) United States Patent
Baba et al.

(10) Patent No.: US 8,918,300 B2
(45) Date of Patent: Dec. 23, 2014

(54) APPARATUS AND METHOD FOR BATTERY STATE OF CHARGE ESTIMATION

(71) Applicants: Atsushi Baba, Saitama (JP); Shuichi Adachi, Kanagawa (JP); Takahiro Kawaguchi, Kanagawa (JP)

(72) Inventors: Atsushi Baba, Saitama (JP); Shuichi Adachi, Kanagawa (JP); Takahiro Kawaguchi, Kanagawa (JP)

(73) Assignees: Calsonic Kansei Corporation, Tokyo (JP); Keio University, Tokyo (JP)

( * ) Notice: Subject to any disclaimer, the term of this patent is extended or adjusted under 35 U.S.C. 154(b) by 0 days.

(21) Appl. No.: 14/349,837

(22) PCT Filed: Oct. 2, 2012

(86) PCT No.: PCT/JP2012/006316
§ 371 (c)(1),
(2), (4) Date: Apr. 4, 2014

(87) PCT Pub. No.: WO2013/051241
PCT Pub. Date: Apr. 11, 2013

(65) Prior Publication Data
US 2014/0257726 A1  Sep. 11, 2014

(30) Foreign Application Priority Data

Oct. 7, 2011 (JP) .................................. 2011-222614

(51) Int. Cl.
*G01R 31/36* (2006.01)
(52) U.S. Cl.
CPC ........ *G01R 31/3648* (2013.01); *G01R 31/3624* (2013.01)
USPC .......................................................... 702/63

(58) Field of Classification Search
CPC ................................................... G01R 31/3648
USPC .............................................................. 702/63
See application file for complete search history.

(56) References Cited

U.S. PATENT DOCUMENTS 7,202,632 B2 * 4/2007 Namba ........................ 320/132
8,340,932 B2 * 12/2012 Ichikawa ........................ 702/63

(Continued)

FOREIGN PATENT DOCUMENTS

DE  102009045526 A1  4/2011
JP  2003149307 A    5/2003

(Continued)

OTHER PUBLICATIONS

International Search Report, PCT/JP2012/006316, mailed Dec. 25, 2012 (1 page).

(Continued)

*Primary Examiner* — Bryan Bui
(74) *Attorney, Agent, or Firm* — Thomas J. Engellenner; Reza Mollaaghababa; Pepper Hamilton LLP

(57) ABSTRACT

An apparatus and method for battery state of charge (SOC) estimation can reduce the estimation error in the battery SOC. The apparatus includes a charge/discharge current detection unit, a terminal voltage detection unit, a first estimation unit that estimates a first SOC by integrating the charge/discharge current value, a second estimation unit that estimates an open circuit voltage value from the charge/discharge current value and the terminal voltage value and estimates a second SOC from the open circuit voltage value, a first difference calculation unit that calculates a SOC difference between the first SOC and the second SOC, an error estimation unit that estimates, based on the SOC difference, an error as a state quantity of an error model by using the error model, and a second difference calculation unit that calculates a SOC of the battery by subtracting the error from the first SOC.

3 Claims, 6 Drawing Sheets

(56) References Cited

U.S. PATENT DOCUMENTS

2003/0052690 A1   3/2003  Schoch
2012/0262126 A1  10/2012  Boehn et al.

FOREIGN PATENT DOCUMENTS

| | | |
|---|---|---|
| JP | 2005201743 A | 7/2005 |
| JP | 2006017544 A | 1/2006 |
| JP | 2010057322 A | 3/2010 |
| JP | 2010200186 A | 9/2010 |
| JP | 2010200418 A | 9/2010 |
| JP | 2010201968 A | 9/2010 |
| JP | 2010207526 A | 9/2010 |
| JP | 201167088 A | 3/2011 |
| WO | 8901169 A1 | 2/1989 |

OTHER PUBLICATIONS

Japanese Office Action issued Jul. 30, 2014 corresponding to Japanese Application No. 2013-502943 with English translation (4 sheets).

European Extended Search Report in corresponding European Application No. 12838665.3, dated Jun. 30, 2014 (6 pages).

* cited by examiner

APPARATUS AND METHOD FOR BATTERY STATE OF CHARGE ESTIMATION

TECHNICAL FIELD

The present invention relates to an apparatus and method for battery state of charge estimation that estimate the state of charge of the battery used in an electric vehicle or the like.

BACKGROUND ART

For example in electric vehicles, hybrid electric vehicles, and the like, a rechargeable battery (secondary battery) is used to provide power (discharge) to an electric motor used for driving such vehicles and to accumulate electric energy by charging from a ground-based power supply or from the electric motor, which is caused to function as an electrical generator of energy during braking.

In this case, in order to maintain the battery in an optimal state for an extended period of time, it is necessary to perform battery management by constantly monitoring the state of the battery, i.e. the State Of Charge (SOC).

As conventional battery state of charge detection methods, a sequential state recording (bookkeeping) method (also referred to as a current integration method or coulomb counting method) and an open circuit voltage estimation method are known. In the sequential state recording method, input and output of the battery voltage, current, and the like are recorded as time series data, the electric charge at the present time is determined by time integrating the current using these data, and the SOC is determined using the initial value of the electric charge in the charged battery and the full charge capacity. In the open circuit voltage estimation method, the input current value and terminal voltage value of the battery are input, and using a battery equivalent circuit model, the open circuit voltage value, which is the state quantity in this model, is sequentially estimated. The state of charge is then estimated based on this open circuit voltage value.

These methods have both advantages and disadvantages. The current integration method is more accurate than the open circuit voltage estimation method for estimating the state of charge over a short time, yet as the time lengthens, error is accumulated, causing accuracy to worsen. By contrast, the open circuit voltage estimation method does not require constant observation, yet since the open circuit voltage varies little with respect to change in the state of charge, this method is inferior to the current integration method when estimating the amount of variation in the state of charge over a short time.

To address this issue, an apparatus for state of charge estimation that improves the state of charge estimation accuracy by correcting the estimation error of the state of charge using both methods for state of charge estimation (i.e. a sensor fusion technique) is known.

A known example of such a conventional sensor fusion type apparatus for battery state of charge estimation includes a first calculation unit that calculates a first remaining capacity by time integrating a charge/discharge current of a battery using a current integration method, a second calculation unit that calculates a second remaining capacity from an open circuit voltage by estimating the open circuit voltage from impedance of a battery equivalent circuit model based on the charge/discharge current and a terminal voltage of the battery using an open circuit voltage estimation method, and a third calculation unit that calculates a remaining capacity of the battery by combining the first remaining capacity and the second remaining capacity after weighting with a weight that is set in accordance with usage conditions of the battery (for example, see Patent Literature 1).

CITATION LIST

Patent Literature 1: JP2005-201743A

SUMMARY

The above conventional apparatus for battery state of charge estimation, however, has the problems described below.

Specifically, with the current integration method, the estimation accuracy over a short time improves by shortening the calculation interval as much as possible, whereas with the open circuit voltage estimation method, a great deal of high frequency noise is included upon shortening the calculation interval, causing the estimation accuracy to worsen. If the estimation results obtained by these estimation methods that have conflicting characteristics are weighted with only a single weight, as above, the resulting estimation accuracy necessarily worsens.

The present invention has been conceived in light of the above problems, and it is an object thereof to provide an apparatus and method for state of charge estimation that can reduce the estimation error in the battery state of charge (SOC).

To achieve this object, an apparatus for battery state of charge estimation according to the present invention as recited in claim 1 includes a charge/discharge current detection unit configured to detect a charge/discharge current value of a battery; a terminal voltage detection unit configured to detect a terminal voltage value of the battery; a current integration method state of charge estimation unit configured to estimate a current integration method state of charge by integrating the charge/discharge current value detected by the charge/discharge current detection unit; an open circuit voltage estimation method state of charge estimation unit configured to estimate an open circuit voltage value of the battery from the charge/discharge current value detected by the charge/discharge current detection unit and the terminal voltage value detected by the terminal voltage detection unit and to estimate an open circuit voltage estimation method state of charge from the open circuit voltage value; a first difference calculation unit configured to calculate a state of charge difference between the current integration method state of charge obtained by the current integration method state of charge estimation unit and the open circuit voltage estimation method state of charge obtained by the open circuit voltage estimation method state of charge estimation unit; an error estimation unit configured to estimate, based on the state of charge difference obtained by the first difference calculation unit, an error as a state quantity of an error model by using the error model; and a second difference calculation unit configured to calculate a state of charge of the battery by subtracting the error estimated by the error estimation unit from a state of charge, between the current integration method state of charge estimated by the current integration method state of charge estimation unit and the open circuit voltage estimation method state of charge estimated by the open circuit voltage estimation method state of charge estimation unit, that is subtracted in the first difference calculation unit (i.e. the subtrahend, not the minuend), such that the error estimation unit includes a Kalman filter that uses the error model.

The apparatus for battery state of charge estimation as recited in claim 2 is the apparatus as recited in claim 1, such that the error model includes at least one of an error in the charge/discharge current detection unit and an error in the terminal voltage detection unit.

A method for battery state of charge estimation according to the present invention as recited in claim 3 includes the steps of (a) detecting a charge/discharge current value of a battery; (b) detecting a terminal voltage value of the battery; (c) estimating a current integration method state of charge by integrating the detected charge/discharge current value; (d) estimating an open circuit voltage value of the battery from the detected charge/discharge current value and the detected terminal voltage value and estimating an open circuit voltage estimation method state of charge from the open circuit voltage value; (e) determining a state of charge difference between the current integration method state of charge and the open circuit voltage estimation method state of charge; (f) estimating, based on the state of charge difference, an error as a state quantity of an error model by using the error model; and (g) calculating a state of charge of the battery by subtracting the error from a state of charge, between the current integration method state of charge and the open circuit voltage estimation method state of charge, that is subtracted in step (e), such that the step (f) includes a Kalman filter that uses the error model.

According to the apparatus for battery state of charge estimation as recited in claim 1, the error estimation unit estimates error from the state of charge difference between the current integration method state of charge and the open circuit voltage estimation method state of charge using an error model, and the second difference calculation unit calculates the state of charge of the battery by subtracting the error from the state of charge, between the current integration method state of charge and the open circuit voltage estimation method state of charge, that is subtracted in the first difference calculation unit. As a result, even if error occurs in the charge/discharge current detection unit or the terminal voltage detection unit, or in the state of charge initial value, the amount of misalignment in the state of charge due to the error is subtracted, thereby reducing the estimation error in the battery state of charge (SOC). Additionally, the error estimation unit includes a Kalman filter that uses the error model. The error, which is a state quantity, can thus be estimated easily and accurately.

According to the apparatus for battery state of charge estimation as recited in claim 3, the error model includes at least one of an error in the charge/discharge current detection unit and an error in the terminal voltage detection unit. Therefore, the magnitude of the estimation error in the state of charge due to these errors can be estimated, thereby improving the estimation accuracy of the state of charge.

According to the method for battery state of charge estimation error is estimated from the state of charge difference between the current integration method state of charge and the open circuit voltage estimation method state of charge using an error model, and the state of charge of the battery is calculated by subtracting the error from the state of charge, between the current integration method state of charge and the open circuit voltage estimation method state of charge, that is subtracted in the step of determining the state of charge difference. Therefore, even if error occurs in the charge/discharge current detection unit or the terminal voltage detection unit, or in the state of charge initial value, the amount of misalignment in the state of charge due to the error is subtracted, thereby reducing the estimation error in the battery state of charge (SOC). Additionally, the error estimation step (f) includes a Kalman filter that uses the error model. The error, which is a state quantity, can thus be estimated easily and accurately.

BRIEF DESCRIPTION OF DRAWINGS

The present invention will be further described below with reference to the accompanying drawings, wherein.

DESCRIPTION OF EMBODIMENTS

Figure 1:
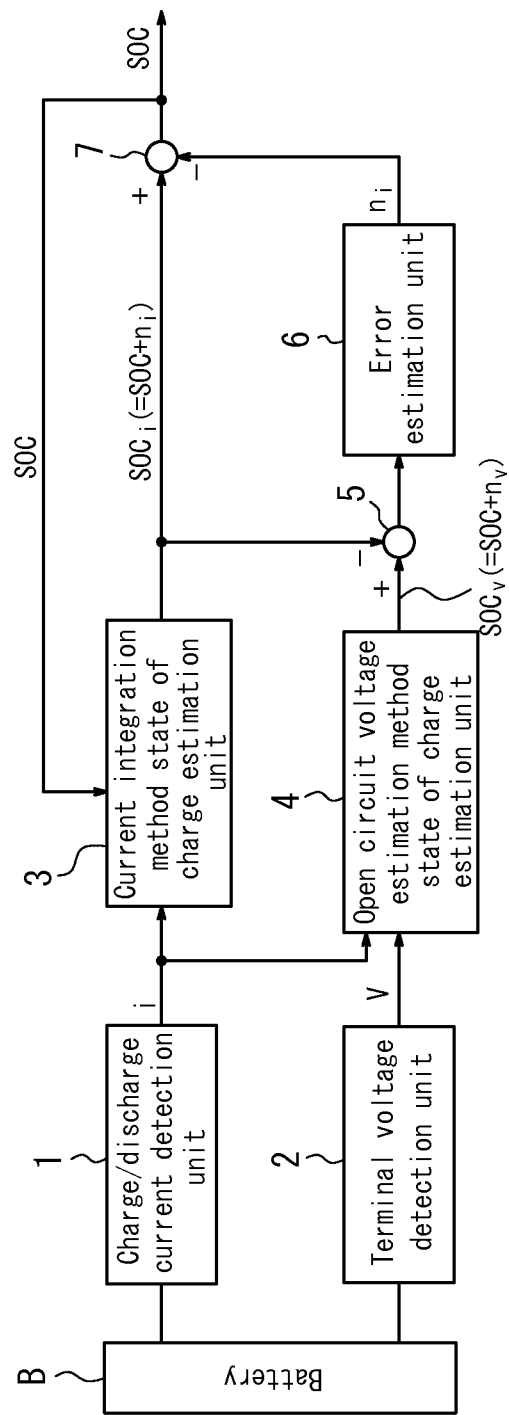
FIG. 1 is a block diagram illustrating the structure of an apparatus for battery state of charge estimation according to Embodiment 1 of the present invention.

The following describes the present invention in detail based on the embodiments illustrated in the drawings.

Embodiment 1

First, the overall structure of the apparatus for battery state of charge estimation according to Embodiment 1 is described.

The apparatus for battery state of charge estimation of Embodiment 1 estimates the state of charge (SOC) of a battery that supplies power to an electric motor or the like installed in an electric vehicle.

As illustrated in FIG. 1, the apparatus for state of charge estimation connected to a battery B includes a charge/discharge current detection unit 1, a terminal voltage detection unit 2, a current integration method state of charge estimation unit 3, an open circuit voltage estimation method state of charge estimation unit 4, a first subtractor 5, an error estimation unit 6, and a second subtractor 7.

The battery B is a rechargeable battery, and a lithium-ion battery, for example, is used in the present embodiment. Note that in the present embodiment, the battery B is not limited to a lithium-ion battery and may of course be a different type of battery, such as a nickel-hydrogen battery or the like.

The charge/discharge current detection unit 1 detects the magnitude of the discharge current when power is provided from the battery B to a non-illustrated electric motor or the like. The charge/discharge current detection unit 1 also detects the magnitude of charge current when the electric motor is caused to function as an electrical generator during braking to collect a portion of the braking energy or during charging by a ground-based power supply system. The charge/discharge current detection unit 1 uses, for example, shunt resistance or the like to detect a charge/discharge current value i flowing in the battery B. The detected charge/discharge current value i is input into both the current integration method state of charge estimation unit 3 and the open circuit voltage estimation method state of charge estimation unit 4 as an input signal.

Note that the charge/discharge current detection unit 1 is not limited to the above configuration and may adopt any of a variety of structures and forms.

Furthermore, the charge/discharge current detection unit 1 can treat an instantaneous value of the charge/discharge current or the average value of the charge/discharge current over a predetermined period of time as the charge/discharge current value i for output to the current integration method state of charge estimation unit 3 and the open circuit voltage estimation method state of charge estimation unit 4.

The terminal voltage detection unit 2 detects the voltage value between terminals of the battery B. The detected terminal voltage value V is input into the open circuit voltage estimation method state of charge estimation unit 4.

Note that the terminal voltage detection unit 2 may adopt any of a variety of structures and forms.

Figure 2:
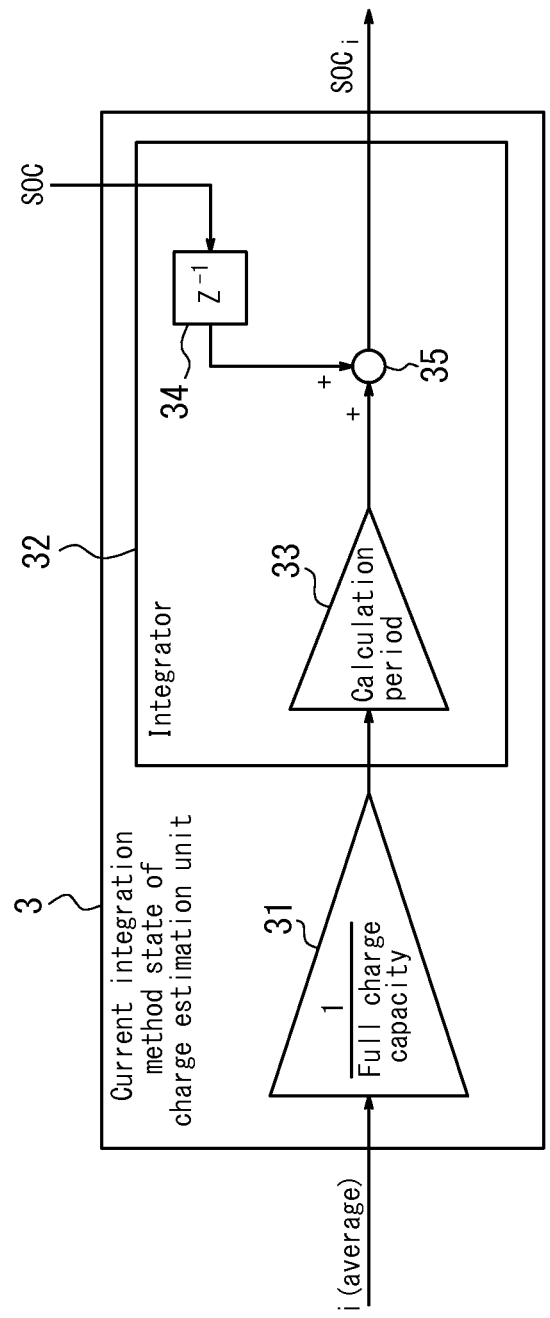
FIG. 2 is a block diagram illustrating the structure of a current integration method state of charge estimation unit used in the apparatus for state of charge estimation of Embodiment 1.

As illustrated in FIG. 2, the current integration method state of charge estimation unit 3 includes a first multiplier 31 and an integrator 32. The integrator 32 includes a second multiplier 33, a delay element 34, and adder 35.

The first multiplier 31 multiplies the charge/discharge current value i input from the charge/discharge current detection unit 1 by 1/(full charge capacity) and outputs the product to the second multiplier 33. The second multiplier 33 further multiplies the product from the first multiplier 31 by a calculation period to calculate the change in the state of charge due to the charge/discharge current that was input at that time, outputting the result to the adder 35.

On the other hand, the state of charge SOC obtained by the second subtractor 7 is input into the delay element 34 of the integrator 32, and the delay element 34 outputs, to the adder 35, the prior state of charge that was obtained by the immediately prior calculation and is one prior to the state of charge SOC calculated by the second subtractor 7. Note that the signal z in the delay element 34 represents a z transform for discretization. Accordingly, $z^{-1}$ yields the prior value.

The adder 35 adds the change in the state of charge input from the second multiplier 33 to the prior state of charge input from the delay element 34 and outputs the resulting value to the first subtractor 5 and the second subtractor 7 as the current integration method state of charge $SOC_i$. This current integration method state of charge $SOC_i$ represents the state of charge SOC that is to be estimated with the addition of noise $n_i$ in the charge/discharge current detection unit 1, in the state of charge initial value, and the like.

In the above calculation, the full charge capacity used in the first multiplier 31 may be the nominal value (the value when the battery is new) or any value that reflects the degree of deterioration of the battery.

In the case of reflecting the degree of deterioration, methods such as those disclosed in JP2010-200418, JP2010-057322, JP2010-200186, or the like, submitted by the present applicant, may be used.

Figure 3:
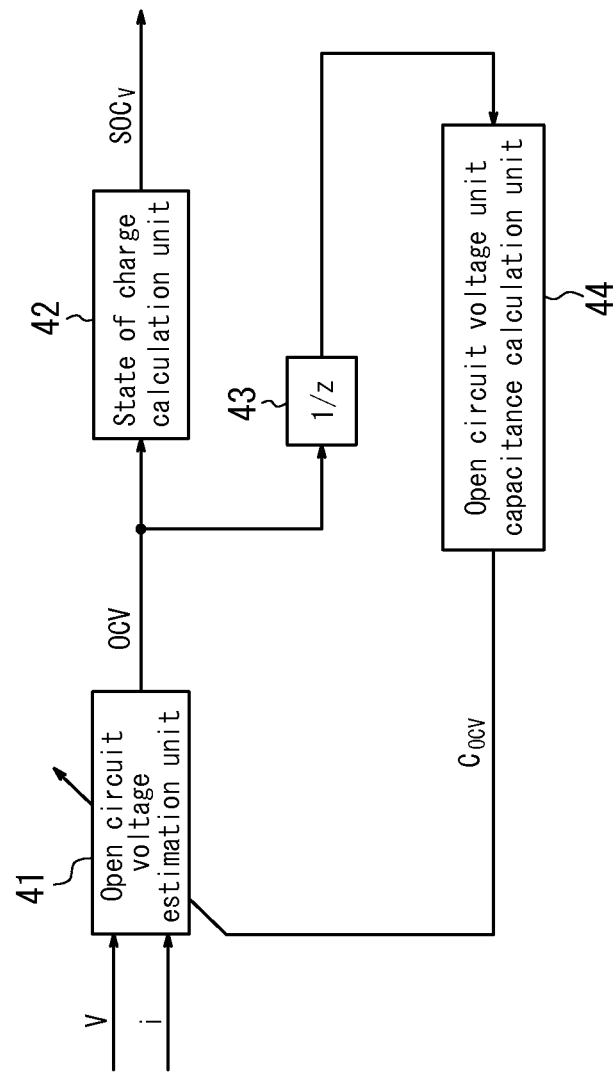
FIG. 3 is a block diagram illustrating the structure of an open circuit voltage estimation method state of charge estimation unit used in the apparatus for state of charge estimation of Embodiment 1.

The open circuit voltage estimation method state of charge estimation unit 4, as illustrated in FIG. 3, includes an open circuit voltage estimation unit 41, a state of charge calculation unit 42, a delay element 43, and an open circuit voltage unit capacitance calculation unit 44.

The charge/discharge current value i from the charge/discharge current detection unit 1, the terminal voltage value V from the terminal voltage detection unit 2, and an open circuit voltage unit capacitance $C_{OCV}$ from the open circuit voltage unit capacitance calculation unit 44 are input into the open circuit voltage estimation unit 41. The open circuit voltage estimation unit 41 estimates an open circuit voltage value OCV using an equivalent circuit model of the battery B and outputs the result to the state of charge calculation unit 42 and the delay element 43.

Figure 4:
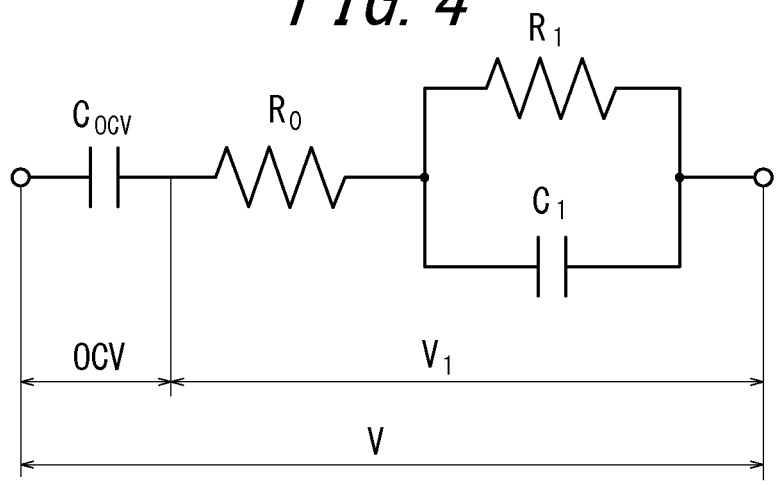
FIG. 4 illustrates the structure of a battery equivalent circuit model used in the open circuit voltage estimation method state of charge estimation unit of FIG. 3.

In the present embodiment, as illustrated in FIG. 4, a Foster-type RC ladder circuit (with only one parallel circuit) is used in the equivalent circuit model of the battery B. In other words, this circuit is a parallel circuit of a resistor ($R_1$: Faradaic impedance, set as response resistance representing dynamic behavior during the charge-transfer process in the battery B) and a capacitor ($C_1$: non-Faradaic impedance, set to represent the electric double layer) connected to a bulk resistor ($R_0$) that sets the direct-current component of ohmic resistance or the like by wire connection with an electrolyte resistor of the battery B. In FIG. 4, the open circuit voltage value of the condenser $C_{OCV}$ representing the open circuit voltage is labeled OCV, the terminal voltage value is labeled V, and the overvoltage value produced in the above parallel circuit is labeled $V_1$. The terminal voltage value V is equivalent to the sum of the open circuit voltage value OCV and the overvoltage value $V_1$.

On the other hand, for estimation of the open circuit voltage value OCV, for example a Kalman filter is used.

A model of the target system is designed (in the present embodiment, a battery equivalent circuit model), and the Kalman filter compares the outputs when the same input signal is input into both the model and the actual system. If there is error in the outputs, the Kalman filter applies Kalman gain to the error and provides feedback to the model, thereby adjusting the model to minimize the error in the outputs. By repeating this operation, the Kalman filter estimates the true internal state quantity.

Note that in the Kalman filter, it is assumed that the observational noise is normal white noise. Accordingly, in this case, the system parameters become random variables, making the true system a stochastic system. Therefore, the observed values can be described by a linear regression model, and the sequential parameter estimation problem can be formulated using a state space representation. Even without recording consecutive state, time-varying parameters can thus be estimated. In this way, from observed values of the input/output data in the target dynamic system, it is possible to create a mathematical model for which, for a predetermined purpose, identity with a target can be explained. In other words, system identification is possible.

The state of charge calculation unit 42 stores data, obtained in advance by experiment, related to the relationship between the open circuit voltage and the state of charge of the battery B as a lookup table, for example. The state of charge calculation unit 42 also calculates the open circuit voltage estimation method state of charge $SOC_V$ corresponding to the open circuit voltage value OCV input from the open circuit voltage estimation unit 41 and outputs the result to the first subtractor 5. The open circuit voltage estimation method state of charge $SOC_V$ is the state of charge SOC with the addition of noise $n_V$, described below.

The delay element 43 receives input of the open circuit voltage value OCV estimated by the open circuit voltage estimation unit 41 and outputs the immediately prior open circuit voltage value OCV to the open circuit voltage unit capacitance calculation unit 44.

Based on the prior open circuit voltage value OCV input from the delay element 43, the open circuit voltage unit capacitance calculation unit 44 calculates the open circuit voltage unit capacitance $C_{OCV}$ and outputs this value to the open circuit voltage estimation unit 41.

Note that a method for state quantity estimation using the above Kalman filter is disclosed in greater detail in JP2010-207526 and JP2010-201968 submitted by the present applicant.

On the other hand, the first subtractor 5 subtracts the current integration method state of charge $SOC_i$ obtained by the current integration method state of charge estimation unit 3 from the open circuit voltage estimation method state of charge $SOC_V$ obtained by the open circuit voltage estimation method state of charge estimation unit 4 and outputs the resulting difference in state of charge to the error estimation unit 6. The first subtractor 5 corresponds to the first difference calculation unit of the present invention.

The error estimation unit 6 estimates error using a Kalman filter with the following structure.

As described above, since the Kalman filter assumes that normal white noise is included in the state quantities and the observables, the Kalman filter is extremely resilient to noise, yet this effect cannot be obtained when the error is not normal white noise.

Therefore, when such non-normal white error is known to exist, the error itself is estimated. Accordingly, the following error model is considered.

Namely, the error model (discrete system) is represented by the following equations.

$$x_{k+1} = Fx_k + Gv_k$$

$$y_k = Hx_k$$

For the above error model equations, the following equations hold.

$$x = \begin{bmatrix} n_i \\ n_v \\ e_y \\ e_u \end{bmatrix}$$

$$v = \begin{bmatrix} v_y \\ v_u \end{bmatrix}$$

$$y = SOC_v - SOC_i$$

$$F = \begin{bmatrix} 1 & 0 & 0 & \frac{T_S}{DC \cdot SOH} \\ 0 & a_2 & -\alpha a_2 & \frac{2a_2 b_0 + a_2 b_1 + b_2 - b_0}{1 - a_2}\alpha \\ 0 & 0 & 0 & 0 \\ 0 & 0 & 0 & 1 \end{bmatrix}$$

$$G = \begin{bmatrix} 0 & 0 \\ \alpha & -\alpha b_0 \\ 1 & 0 \\ 0 & 1 \end{bmatrix}$$

$$H = \begin{bmatrix} -1 & 1 & 0 & 0 \end{bmatrix}$$

In the above equations, x represents state variables, y represents observed values, v represents noise input, F represents a state matrix, G represents an input matrix, H represents an output matrix, and the subscript k represents time. Furthermore, $n_i$ represents the error in the current integration method state of charge $SOC_i$, $n_v$ represents the error in the open circuit voltage estimation method state of charge $SOC_V$, $e_y$ represents the error in the terminal voltage detection unit 2, $e_u$ represents the error in the charge/discharge current detection unit 1, $v_y$ represents the (normal white) noise in the terminal voltage detection unit 2, and $v_u$ represents the (normal white) noise in the charge/discharge current detection unit 1. $T_S$ represents the calculation period, DC the design capacity, and SOH the state of health, whereas $a_1$, $a_2$, $b_0$, $b_1$, $b_2$, and $\alpha$ are coefficients.

The Kalman filter algorithm for the above system is shown below.

Kalman gain: $K_k = P_{k-1} H^T (H P_{k-1} H^T)^{-1}$ (1)

Estimated value (average): $x_k = F x_{k-1} + K_k (y_k - H F x_{k-1})$ (2)

Estimated value (variance): $P_k = F(P_{k-1} - K_k H P_{k-1}) F^T + GQG^T$ (3)

The superscript T represents the transpose of a matrix.

Figure 5:
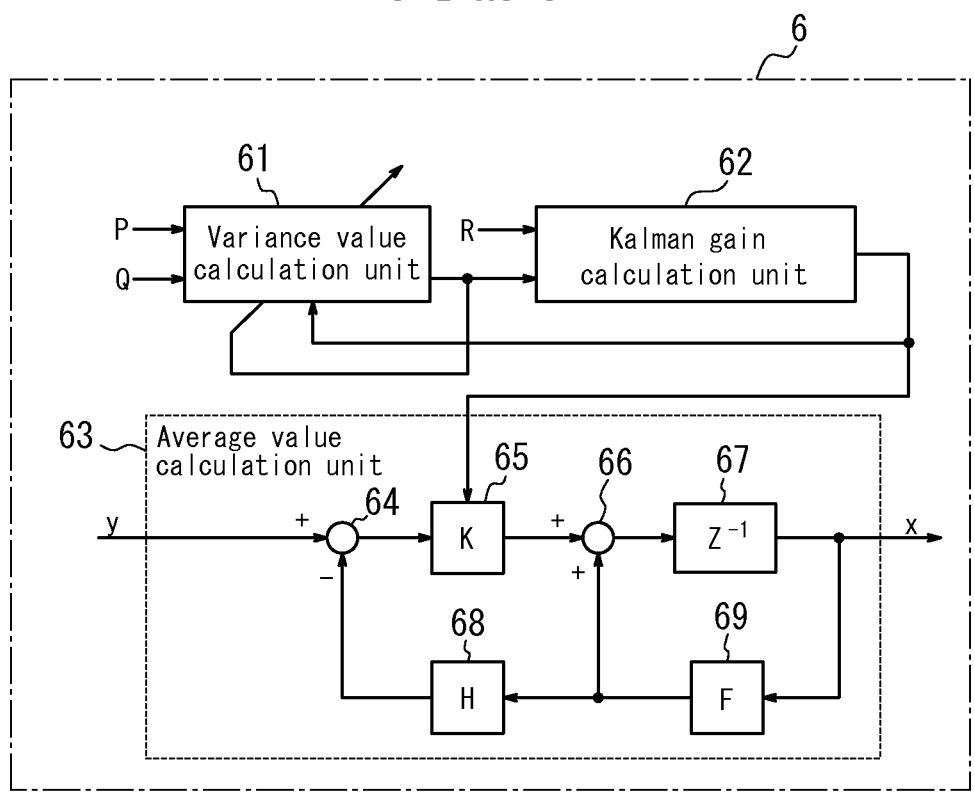
FIG. 5 is a block diagram illustrating the structure of an error estimation unit used in the apparatus for state of charge estimation of Embodiment 1.

Accordingly, as illustrated by the block diagram in FIG. 5, the error estimation unit 6 includes a variance value calculation unit 61, a Kalman gain calculation unit 62, and an average value calculation unit 63. The average value calculation unit 63 includes a subtractor 64, a first coefficient multiplier 65, an adder 66, a delay element 67, a second coefficient multiplier 68, and a third coefficient multiplier 69. The variance value calculation unit 61 performs the calculation in Equation (3), the Kalman gain calculation unit 62 performs the calculation in Equation (1), and the average value calculation unit 63 performs the calculation in Equation (2).

On the other hand, the second subtractor 7 subtracts the error $n_i$ input from the error estimation unit 6 from the current integration method state of charge $SOC_i$ (i.e. $SOC + n_i$) input from the current integration method state of charge estimation unit 3, outputting the resulting value as the estimated state of charge SOC of the apparatus for state of charge estimation and inputting the value into the current integration method state of charge estimation unit 3. The second subtractor 7 corresponds to the second difference calculation unit of the present invention.

Next, operations of the apparatus for state of charge estimation according to Embodiment 1 with the above structure are described.

Upon turning the power to the vehicle ON, the charge/discharge current detection unit 1 detects the charge/discharge current value i of the battery B and inputs the detected value into the current integration method state of charge estimation unit 3 and the open circuit voltage estimation method state of charge estimation unit 4.

Meanwhile, the terminal voltage detection unit 2 detects the terminal voltage value V of the battery B and inputs the detected value into the open circuit voltage estimation method state of charge estimation unit 4.

The current integration method state of charge estimation unit 3 time integrates the charge/discharge current value i input from the charge/discharge current detection unit 1 and estimates the current integration method state of charge $SOC_i$ using the state of charge SOC input from the second subtractor 7, inputting the result into the first subtractor 5. Note that the current integration method state of charge $SOC_i$ includes the error $n_i$, which includes the detection error (offset error) in the charge/discharge current detection unit 1, the setting error in the state of charge initial value, and the like.

On the other hand, the open circuit voltage estimation method state of charge estimation unit 4 receives input of the charge/discharge current value i from the charge/discharge current detection unit 1 and the terminal voltage value V from the terminal voltage detection unit 2 and calculates the open circuit voltage value OCV with a Kalman filter that uses the battery equivalent circuit model of FIG. 4. The open circuit voltage estimation method state of charge estimation unit 4 then estimates the open circuit voltage estimation method state of charge $SOC_V$ from the open circuit voltage value OCV using a lookup table, inputting the result into the first subtractor 5.

The first subtractor 5 subtracts the current integration method state of charge $SOC_i$ from the open circuit voltage estimation method state of charge $SOC_V$ and inputs this state of charge difference into the error estimation unit 6.

The error estimation unit 6 receives input of the state of charge difference from the first subtractor 5, estimates the error $n_i$ in the system with a Kalman filter, and inputs the error $n_i$ into the second subtractor 7.

The second subtractor 7 subtracts the error $n_i$ obtained by the error estimation unit 6 from the current integration method state of charge $SOC_i$ obtained by the current integration method state of charge estimation unit 3 to obtain the state of charge SOC, outputs the state of charge SOC, and inputs the state of charge SOC into the current integration method state of charge estimation unit 3. The state of charge SOC obtained in this way is used as one index for vehicle battery management.

Figure 6:
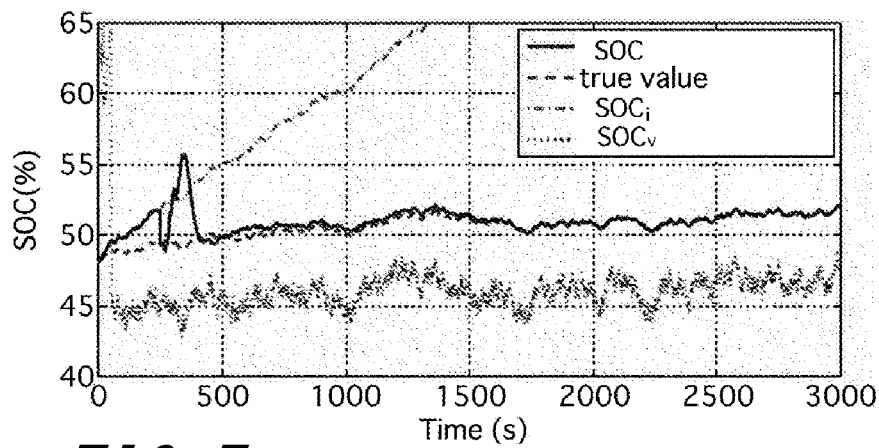
FIG. 6 shows results for simulation of state of charge estimation with the apparatus for state of charge estimation of Embodiment 1 when offset error occurs in the charge/discharge current detection unit.
Figure 7:
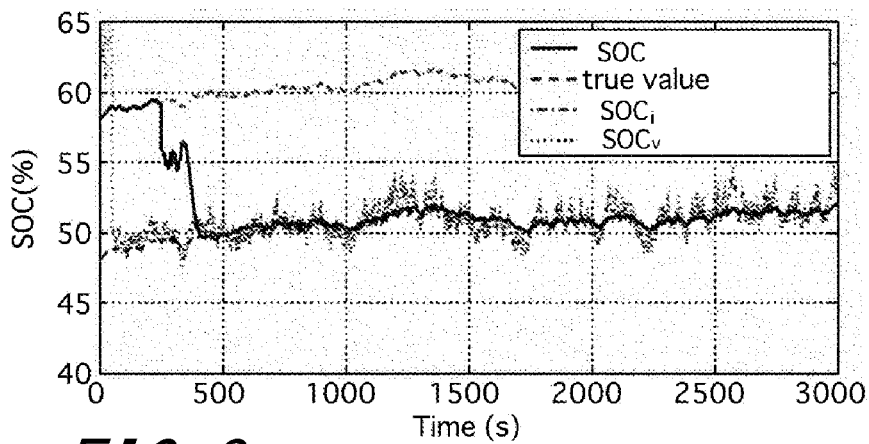
FIG. 7 shows results for simulation of state of charge estimation with the apparatus for state of charge estimation of Embodiment 1 when error occurs in the state of charge initial value.
Figure 8:
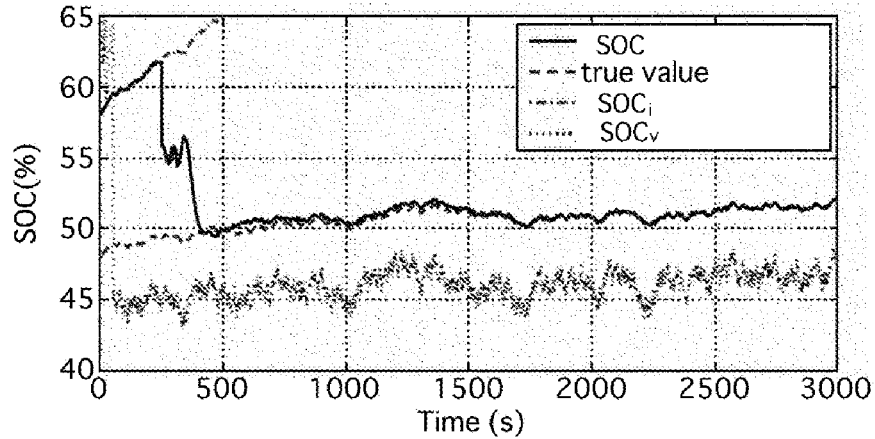
FIG. 8 shows results for simulation of state of charge estimation with the apparatus for state of charge estimation of Embodiment 1 when offset error occurs in the charge/discharge current detection unit and error occurs in the state of charge initial value.

Next, the results of a simulation using the apparatus for battery state of charge estimation with the above structure are shown in FIGS. 6 through 8. In the figures, the true value of the state of charge is represented as a dashed line, the current integration method state of charge $SOC_i$ as an alternate long and short dash line, the open circuit voltage estimation method state of charge $SOC_V$ as a dotted line, and the state of charge SOC obtained by the second subtractor 7 using the current integration method state of charge $SOC_i$ and the open circuit voltage estimation method state of charge $SOC_V$ as a solid line. In FIGS. 6 through 8, the horizontal axis represents time [s], and the vertical axis represents state of charge [%].

First, FIG. 6 shows the simulation results for when an offset error (0.5 A in this example) occurs in the charge/discharge current detection unit 1. Error accumulates over time in the current integration method state of charge $SOC_i$, which gradually becomes larger than the true value of the state of charge. By contrast, the open circuit voltage estimation method state of charge $SOC_V$ is smaller than the true value and fluctuates unstably. However, the state of charge SOC obtained by the second subtractor 7 remains quite close to the true value after approximately 450 s have elapsed, showing that the estimation error can be kept small.

FIG. 7 shows the simulation results for when an error of 10% occurs in the state of charge initial value SOC. The current integration method state of charge $SOC_i$ continues to be larger than the true value of the state of charge regardless of the amount of elapsed time. On the other hand, while taking a value close to the true value, the open circuit voltage estimation method state of charge $SOC_V$ is unstable, becoming both larger and smaller than the true value. However, the state of charge SOC obtained by the second subtractor 7 remains quite close to the true value after approximately 450 s have elapsed, showing that the estimation error can be kept small.

FIG. 8 shows the simulation results for when an offset error (0.5 A in this example) occurs in the charge/discharge current detection unit 1 and an error of 10% occurs in the state of charge initial value SOC. The current integration method state of charge $SOC_i$ is much higher than the true value of the state of charge near the start, and error further accumulates as time elapses, yielding an even larger value. By contrast, the open circuit voltage estimation method state of charge $SOC_V$ is smaller than the true value and fluctuates unstably. However, despite being much higher that the true value at first, the state of charge SOC obtained by the second subtractor 7 remains quite close to the true value after approximately 450 s have elapsed, showing that the estimation error can be kept small.

As is clear from the above description, the apparatus for state of charge estimation according to Embodiment 1 has the following effects.

Namely, with the apparatus for state of charge estimation according to Embodiment 1, the state of charge difference between the current integration method state of charge $SOC_i$ and the open circuit voltage estimation method state of charge $SOC_V$ is determined in the first subtractor 5, the error $n_i$ is estimated from the state of charge difference using an error model in the error estimation unit 6, and the error $n_i$ is subtracted from the current integration method state of charge $SOC_i$ (the state of charge that is subtracted in the first subtractor 5) in the second subtractor 7 to calculate the state of charge SOC of the battery B. As a result, even if error occurs in the charge/discharge current detection unit 1 or the terminal voltage detection unit 2, or in the state of charge initial value, the amount of misalignment in the state of charge due to the error is subtracted, thereby reducing the estimation error in the battery state of charge SOC.

Furthermore, the error estimation unit 6 includes a Kalman filter that uses an error model. The error $n_i$, which is a state quantity, can thus be estimated easily and accurately.

Since the error model includes at least one of error ($e_u$) in the charge/discharge current detection unit 1 and error ($e_y$) in the terminal voltage detection unit 2, the magnitude of the estimation error $n_i$ in the state of charge SOC due to these errors can be estimated, thereby improving the estimation accuracy of the state of charge SOC.

Next, another embodiment is described. In the description of this other embodiment, structural components similar to Embodiment 1 are not illustrated or are labeled with the same reference signs, and a description thereof is omitted. Only the differences are described.

Embodiment 2

Next, the apparatus for battery state of charge estimation according to Embodiment 2 of the present invention is described based on the attached drawings.

Figure 9:
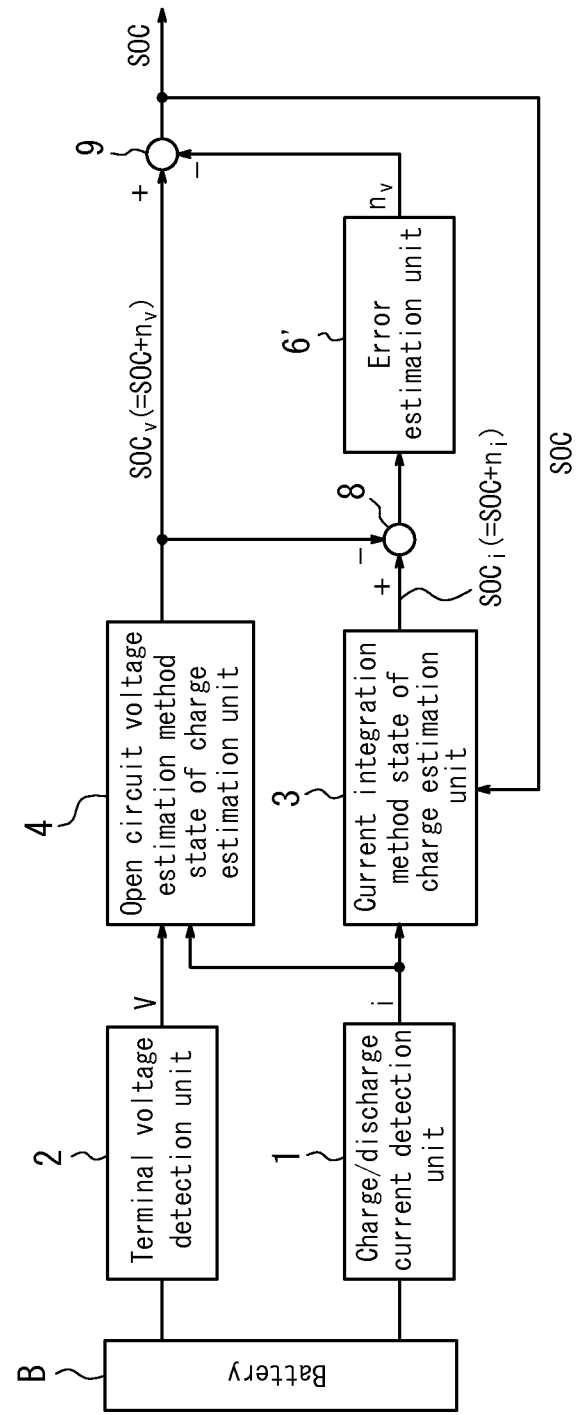
FIG. 9 is a block diagram illustrating the structure of an apparatus for battery state of charge estimation according to Embodiment 2 of the present invention.

In the apparatus for battery state of charge estimation according to Embodiment 2, the state variable x ultimately determined in an error estimation unit 6' using a Kalman filter represents both the error $n_i$ and the error $n_V$, and therefore the structure in FIG. 9 is adopted, with the current integration method state of charge estimation unit 3 and the open circuit voltage estimation method state of charge estimation unit 4 of Embodiment 1 reversed.

In other words, the current integration method state of charge $SOC_i$ obtained in the current integration method state of charge estimation unit 3 is input into a first subtractor 8. On the other hand, the open circuit voltage estimation method state of charge $SOC_V$ obtained by the open circuit voltage estimation method state of charge estimation unit 4 is input into a second subtractor 9 and the first subtractor 8.

The first subtractor 8 subtracts the open circuit voltage estimation method state of charge $SOC_V$ from the current integration method state of charge $SOC_i$ and inputs the state of charge difference into the error estimation unit 6'. The error estimation unit 6' estimates the error $n_V$ from the state of charge difference using the Kalman filter and inputs the result into the second subtractor 9.

The second subtractor 9 subtracts the error $n_V$ obtained by the error estimation unit 6' from the open circuit voltage estimation method state of charge $SOC_V$ obtained by the open circuit voltage estimation method state of charge estimation unit 4 to calculate the state of charge SOC. The remaining structure is the same as in Embodiment 1.

Accordingly, in the apparatus for battery state of charge estimation of Embodiment 2 as well, similar operations and effects as those of Embodiment 1 can be obtained.

The present invention has been described based on the above embodiments, yet the present invention is not limited to these embodiments and includes any design modification or the like within the spirit and scope of the present invention.

For example, the current integration method state of charge estimation unit may have a different structure than in the embodiments. The current integration method state of charge estimation unit 3 in the embodiments, for example, uses the state of charge SOC from the second subtractor 7, yet this example is not limiting, and alternatively the current integration method state of charge estimation unit 3 may instead use the current integration method state of charge $SOC_i$ that it calculates itself.

The open circuit voltage estimation method state of charge estimation unit may also have a different structure than in the embodiments.

Furthermore, the error estimation unit and the open circuit voltage estimation method state of charge estimation unit are not limited to a Kalman filter and may estimate the state quantity using a different adaptive filter.

In the embodiments, an error model using both $e_u$ and $e_y$ is constructed assuming error in both the charge/discharge current detection unit 1 and the terminal voltage detection unit 2, but either one alone may be used.

In this case, taking only the error in the charge/discharge current detection unit 1 ($e_u$) into consideration yields a more accurate state of charge SOC. The reason is that since the charge/discharge current value i detected in the charge/discharge current detection unit 1 is input for calculation into both the current integration method state of charge estimation unit 3 and the open circuit voltage estimation method state of charge estimation unit 4, the effect of this error grows large.

By contrast, the error in the terminal voltage detection unit 2 ($e_y$) only affects the open circuit voltage estimation method state of charge estimation unit 4. Accordingly, the estimation accuracy of the state of charge SOC may fall below that of when only the error in the charge/discharge current detection unit 1 ($e_u$) is taken into consideration, yet even in this case, the estimation accuracy of the state of charge SOC can be reliably improved as compared to when error is not taken into consideration.

Furthermore, the apparatus and method for battery state of charge estimation according to the present invention are not limited to an electric vehicle and may also be used as an apparatus and method for battery state of charge estimation in a vehicle such as a hybrid vehicle that can be driven by both an internal combustion engine and an electric motor, and as an apparatus and method for battery state of charge estimation in another field.

REFERENCE SIGNS LIST

B: Battery
1: Charge/discharge current detection unit
2: Terminal voltage detection unit
3: Current integration method state of charge estimation unit
31: First multiplier
32: Integrator
33: Second multiplier
34: Delay element
35: Adder
4: Open circuit voltage estimation method state of charge estimation unit
41: Open circuit voltage estimation unit
42: State of charge calculation unit
43: Delay element
44: Open circuit voltage unit capacitance calculation unit
5: First subtractor (first difference calculation unit)
6, 6': Error estimation unit
61: Variance value calculation unit
62: Kalman gain calculation unit
63: Average value calculation unit
64: Subtractor
65: First coefficient multiplier
66: Adder
67: Delay element
68: Second coefficient multiplier
69: Third coefficient multiplier
7: Second subtractor (second difference calculation unit)
8: First subtractor (first difference calculation unit)
9: Second subtractor (second difference calculation unit)

The invention claimed is:

1. An apparatus for battery state of charge estimation comprising:
   a charge/discharge current detection unit configured to detect a charge/discharge current value of a battery;
   a terminal voltage detection unit configured to detect a terminal voltage value of the battery;
   a current integration method state of charge estimation unit configured to estimate a current integration method state of charge by integrating the charge/discharge current value detected by the charge/discharge current detection unit;
   an open circuit voltage estimation method state of charge estimation unit configured to estimate an open circuit voltage value of the battery from the charge/discharge current value detected by the charge/discharge current detection unit and the terminal voltage value detected by the terminal voltage detection unit and to estimate an open circuit voltage estimation method state of charge from the open circuit voltage value;
   a first difference calculation unit configured to calculate a state of charge difference between the current integration method state of charge obtained by the current integration method state of charge estimation unit and the open circuit voltage estimation method state of charge obtained by the open circuit voltage estimation method state of charge estimation unit;
   an error estimation unit configured to estimate, based on the state of charge difference obtained by the first difference calculation unit, an error as a state quantity of an error model by using the error model; and
   a second difference calculation unit configured to calculate a state of charge of the battery by subtracting the error estimated by the error estimation unit from a state of charge, between the current integration method state of charge estimated by the current integration method state of charge estimation unit and the open circuit voltage estimation method state of charge estimated by the open circuit voltage estimation method state of charge estimation unit, that is subtracted in the first difference calculation unit, wherein the error estimation unit includes a Kalman filter that uses the error model.

2. The apparatus according to claim 1, wherein the error model includes at least one of an error in the charge/discharge current detection unit and an error in the terminal voltage detection unit.

3. A method for battery state of charge estimation, comprising the steps of:
(a) detecting a charge/discharge current value of a battery;
(b) detecting a terminal voltage value of the battery;
(c) estimating a current integration method state of charge by integrating the detected charge/discharge current value;
(d) estimating an open circuit voltage value of the battery from the detected charge/discharge current value and the detected terminal voltage value and estimating an open circuit voltage estimation method state of charge from the open circuit voltage value;
(e) determining a state of charge difference between the current integration method state of charge and the open circuit voltage estimation method state of charge;
(f) estimating, based on the state of charge difference, an error as a state quantity of an error model by using the error model; and
(g) calculating a state of charge of the battery by subtracting the error from a state of charge, between the current integration method state of charge and the open circuit voltage estimation method state of charge, that is subtracted in step (e), wherein the step (f) includes a Kalman filter that uses the error model.

* * * * *

UNITED STATES PATENT AND TRADEMARK OFFICE
CERTIFICATE OF CORRECTION

PATENT NO. : 8,918,300 B2
APPLICATION NO. : 14/349837
DATED : December 23, 2014
INVENTOR(S) : Atsushi Baba et al.

It is certified that error appears in the above-identified patent and that said Letters Patent is hereby corrected as shown below:

On the Title Page:

Item [73]

Assignees: Calsonic Kansei Corporation, Tokyo (JP); Keio University, Tokyo (JP)

should read:

Assignees: Calsonic Kansei Corporation, Saitama (JP); Keio University, Tokyo (JP)

Signed and Sealed this
Seventh Day of April, 2015

Michelle K. Lee
*Director of the United States Patent and Trademark Office*